United States Patent [19]

Niemetz

[11] 4,413,192
[45] Nov. 1, 1983

[54] TRANSISTOR FIRING CIRCUIT

[75] Inventor: Linhard Niemetz, Nuremberg, Fed. Rep. of Germany

[73] Assignee: Licentia Patent-Verwaltungs-GmbH, Frankfurt am Main, Fed. Rep. of Germany

[21] Appl. No.: 263,101

[22] Filed: May 13, 1981

[30] Foreign Application Priority Data

May 20, 1980 [DE] Fed. Rep. of Germany ....... 3019162

[51] Int. Cl.³ .......................... H03K 3/00; H03K 3/26; H01J 29/70; H01J 29/76
[52] U.S. Cl. .................................... 307/278; 307/310; 315/401; 315/408
[58] Field of Search ............... 307/310, 318, 278, 491; 315/401, 408, 399

[56] References Cited

U.S. PATENT DOCUMENTS 3,523,198  8/1970  Keller ................................. 307/318
3,638,049  1/1972  Wouterus Bom ................... 307/310
3,710,131  1/1973  Ford ................................. 307/10 R
4,277,730  7/1981  Colombo ........................... 315/408

FOREIGN PATENT DOCUMENTS 1152139  8/1963  Fed. Rep. of Germany ...... 315/408
2238846  of 1975  France .
2295249  of 1976  France .

Primary Examiner—John S. Heyman
Assistant Examiner—Timothy P. Callahan
Attorney, Agent, or Firm—Spencer & Frank

[57] ABSTRACT

In a transistor firing circuit including a transistor, a firing coil having a primary winding across which a flyback voltage appears, and a Zener diode connected at the input side of the transistor for limiting the amplitude of the flyback voltage, there is further provided a resistive voltage divider connected to the transistor and the diode and composed of at least one resistor having a temperature coefficient selected for at least partly compensating for the temperature coefficient of the Zener diode in a manner to maintain the flyback voltage amplitude within narrow, defined limits over the operating temperature range of the circuit.

4 Claims, 1 Drawing Figure

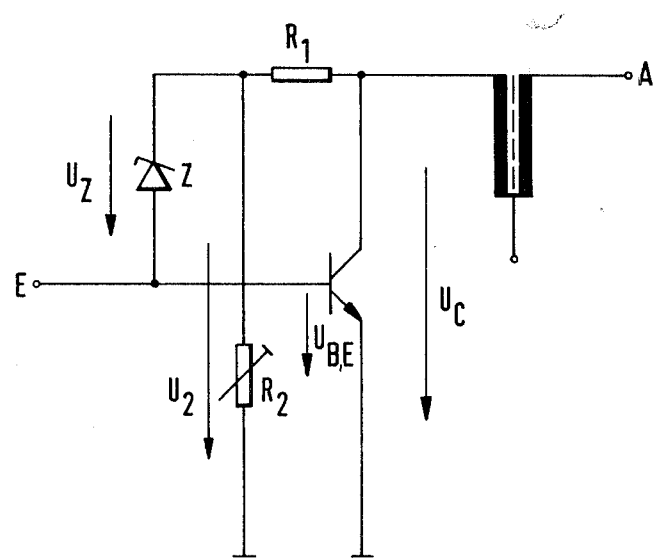

TRANSISTOR FIRING CIRCUIT

BACKGROUND OF THE INVENTION

The present invention relates to a transistor firing circuit of the type including a firing transformer having a primary winding across which there is produced a flyback voltage which is limited in a manner to remain constant within narrow, defined limits over the operating temperature range of the circuit.

Over a wide temperature range, e.g. between $-28°$ C. and $+115°$ C., such transistor firing circuits must have a relatively constant flyback voltage across the primary winding. This constant voltage can be realized with a corresponding number of flux diodes which are connected in series with a Zener diode. Depending on the rated voltage $U_Z$ and the temperature coefficient $T_{K,Z}$ of the Zener diode employed and the rated voltage and temperature coefficient of the flux diodes, a relatively large number of flux diodes would be required to effect temperature compensation. The following example of the prior art will serve to explain this in detail.

A Zener diode with a rated voltage $U_Z=150$ V and a temperature coefficient $T_{K,Z}=+10\cdot10^{-4}$ K$^{-1}$ is temperature compensated by flux diodes with a rated voltage $U_F=0.6$ V and having a temperature coefficient $T_{K,F}=-33\cdot10^{-4}$ K$^{-1}$. The change in voltage of the Zener diode is $150\cdot10\cdot10^{-4}$ VK$^{-1}=0.150$ VK$^{-1}$; the change in voltage of a flux diode is $-0.6$ V$\cdot33\cdot10^{-4}$ K$^{-1}=0.002$ VK$^{-1}$. Consequently, $(150:2)=75$ flux diodes must be connected in series. However, such a series circuit has a total voltage drop of $150$ V$+75.0\cdot0.6$ V$=195$ V.

SUMMARY OF THE INVENTION

It is an object of the present invention to provide a transistor firing circuit which operates with a Zener diode and an ohmic voltage divider and with which it is possible to keep the flyback voltage occurring across the primary winding of the firing coil within narrow limits over a wide temperature range.

The above and other objects are achieved, according to the invention, in a transistor firing circuit including a transistor, a firing coil having a primary winding across which a flyback voltage appears, and a Zener diode connected at the input side of the transistor for limiting the amplitude of the flyback voltage, by the provision of a resistive voltage divider connected to the transistor and the diode and composed of at least one resistor having a temperature coefficient selected for at least partly compensating for the temperature coefficient of the Zener diode in a manner to maintain the flyback voltage amplitude within narrow, defined limits over the operating temperature range of the circuit.

The advantages realized with the present invention reside in particular in that the use of the film resistor with a precisely defined temperature curve makes it possible to limit the flyback voltage across the firing coil in a relatively narrow and constant manner over a wide temperature range. A further advantage is that the temperature dependent resistor can be adapted to the Zener diode employed by appropriate selection of a thick film resistor paste which has the desired resistance value and temperature characteristic. The fundamental structure and method of manufacturing such resistors are disclosed in U.S. Pat. No. 3,714,709.

BRIEF DESCRIPTION OF THE DRAWING

The sole FIGURE is a circuit diagram of a preferred embodiment of a circuit according to the invention.

DESCRIPTION OF THE PREFERRED EMBODIMENTS

In the circuit shown in the FIGURE, the collector-emitter path of a transistor is connected in parallel with a resistive voltage divider $R_1$, $R_2$ between the output primary winding and ground. Resistor $R_2$ serves to set the flyback voltage limitation. Between the base of the transistor, which constitutes the circuit input E, and the center point of the voltage divider $R_1$, $R_2$ the Zener diode Z is connected. If the voltage $U_2$ across resistor $R_2$, which results from the dividing ratio $R_1/R_2$ and the flyback voltage $U_C$ between the collector and ground exceeds the sum of the Zener voltage $U_Z$ and the transistor base-emitter voltage $U_{BE}$, the Zener diode becomes conductive and actuates the transistor, i.e, the flyback voltage is limited.

Due to the temperature coefficient of the voltage of the Zener diode, the flyback voltage across collector $U_C$ would change with a change in temperature. In order to prevent such change in the flyback voltage, the temperature coefficient of the resistor $R_1$ or of the resistor $R_2$ is selected in such a manner that the Zener voltage $U_Z$ is temperature compensated over a broad range and the flyback voltage is maintained within narrow limits over the broad temperature range.

According to one specific practical embodiment, the collector voltage $U_C$ is assumed to lie between 360 V and 385 V in a temperature range between $-28°$ C. and $+115°$ C. If a transistor is selected which has $U_{BE}=2$ V and a Zener diode which has $U_Z=150$ V, the dividing ratio of $$\frac{R_1}{R_2} = \frac{U_C}{U_2} - 1 = \frac{370}{152} - 1 = 1.43$$

results for $$U_C = U_2\left(1 + \frac{R_1}{R_2}\right)$$

Without consideration of the temperature curve of the voltage divider, the permitted temperature coefficient of the Zener diode is calculated as follows:

$$T_{K,Z} = \frac{\Delta U_C}{U_Z \cdot \left(1 + \frac{R_1}{R_2}\right)} \cdot \frac{1}{\Delta \theta} = \frac{(385 - 360)}{150 \cdot (2.43)} \cdot \frac{1}{(115 + 28)} \quad [1]$$

$$T_{K,Z} = +4.8 \cdot 10^{-4} K^{-1}$$

The temperature coefficient of a commercially available 150 V Zener diode, however, lies at $(+9$ to $+13)\cdot10^{-4}$ K$^{-1}$, so that the temperature coefficient of the voltage divider must be considered in order to arrive at the required voltage range of between 360 V and 385 V.

With a Zener diode having $U_Z=150$ V and $T_{K,Z}=+9\cdot10^{-4}$ K$^{-1}$ and a transistor with $U_{B,E}=2$ V and $T_{K,BE}=-5\cdot10^{-3}$ V$\cdot$K$^{-1}$ the following applies at 25° C.

[2]

-continued $$\frac{R_1}{R_2} = \frac{U_C}{U_2} - 1 = 1.43$$

at 115° C. [3]

$$U_Z^{115} = 150 (1 + 9 \cdot 10^{-4} \cdot 90) = 162.15 V$$

$$U_{B,E}^{115} = 2 (1 - 5 \cdot 10^{-3} \cdot 90) = 1.10 V$$

$$U_2^{115} = U_Z^{115} + U_{B,E}^{115} = 163.25 V$$

According to the present invention, $U_C$ is to be constant, so that $$\frac{R_1^{115}}{R_2} = \frac{U_C}{U_2^{115}} - 1 = \frac{370}{163.25} - 1 = 1.266$$ [4]

With $R_2$ = constant, the result is $R_2^{25} = R_2^{115}$ and $$\frac{\frac{R_1^{25}}{R_2^{25}}}{\frac{R_1^{115}}{R_2^{115}}} = \frac{1.43}{1.266} = \frac{R_1^{25}}{R_1^{115}}$$ [5]

$$R_1^{115} = R_1^{25} \cdot \frac{1.266}{1.43} = 0.885 \cdot R_1^{25} = R_1^{25} (1 + T_{K,R} \cdot \Delta\theta)$$

and $T_{K,R} = \frac{0.885 - 1}{90} = -13 \cdot 10^{-4} K^{-1}$

The resistor $R_1$ must have a temperature coefficient which is opposite in sign, or polarity, to that of the Zener diode.

If compensation is effected by giving resistor $R_2$ a temperature-dependent resistance, the polarity, or sign, of its temperature coefficient must be the same as that of the Zener diode.

If the Zener diode has a positive temperature coefficient and the thick film resistor $R_1$ has a negative temperature coefficient, a material which could be utilized for the resistor $R_1$ is a thermistor composition based on ruthenium oxide, which composition has a negative temperature coefficient. The thick film resistor $R_2$ could be made of a resistance composition, which composition has a nearly constant temperature coefficient. A suitable value for the resistor $R_1$ is 1500 Ohms and for the resistor $R_2$ is 1000 Ohms, if the Zener diode has a Zener voltage of 150 volts. The reference temperature is 25 degrees Celsius. The transistor can be a silicon power transistor. The aforementioned flux diodes are diodes of normal type like 1 N 4001, which work in forward direction.

It will be understood that the above description of the present invention is susceptible to various modifications, changes and adaptations, and the same are intended to be comprehended within the meaning and range of equivalents of the appended claims.

What is claimed is:

1. A transistor firing circuit comprising: a firing transformer having a primary winding across which a flyback voltage appears; means defining a circuit ground; a transistor having a base and a collector-emitter path, with said collector-emitter path being connected between said primary winding and said circuit ground; a resistive voltage divider connected in parallel with said collector-emitter path and including first and second resistors connected together at a center point, with said first resistor being connected between said center point and said primary winding and said second resistor being connected between said center point and said circuit ground; means defining a circuit input connected directly to said transistor base; and a Zener diode connected between said center point and said circuit input; wherein said first resistor has a temperature coefficient of resistance which is opposite in sign to the temperature coefficient to said Zener diode and of a value to compensate the temperature coefficient to said Zener diode in a manner to maintain the flyback voltage amplitude within narrow, defined limits over the operating temperature range of said circuit.

2. A circuit as defined in claim 1 wherein said voltage divider comprises thick film resistors which are applied onto a substrate.

3. A transistor firing circuit comprising: a firing transformer having a primary winding across which a flyback voltage appears; means defining a circuit ground; a transistor having a base and a collector-emitter path, with said collector-emitter path being connected between said primary winding and said circuit ground; a resistive voltage divider connected in parallel with said collector-emitter path and including first and second resistors connected together at a center point, with said first resistor being connected between said center point and said primary winding and said second resistor being connected between said center point and said circuit ground; means defining a circuit input connected directly to said transistor base; and a Zener diode connected between said center point and said circuit input; wherein said second resistor has a temperature coefficient of resistance which is of the same sign as the temperature coefficient of said Zener diode and of a value to compensate the temperature coefficient of said Zener diode in a manner to maintain the flyback voltage amplitude within narrow, defined limits over the operating temperature range of said circuit.

4. A circuit as defined in claim 3 wherein said voltage divider comprises thick film resistors which are applied onto a substrate.

* * * * *